United States Patent
Inden

(10) Patent No.: US 11,967,557 B2
(45) Date of Patent: Apr. 23, 2024

(54) SEMICONDUCTOR DEVICE AND MANUFACTURING METHOD THEREOF

(71) Applicant: Kioxia Corporation, Tokyo (JP)

(72) Inventor: Tomoya Inden, Mie (JP)

(73) Assignee: KIOXIA CORPORATION, Tokyo (JP)

(*) Notice: Subject to any disclaimer, the term of this patent is extended or adjusted under 35 U.S.C. 154(b) by 148 days.

(21) Appl. No.: 17/685,970

(22) Filed: Mar. 3, 2022

(65) Prior Publication Data

US 2022/0399276 A1 Dec. 15, 2022

(30) Foreign Application Priority Data

Jun. 15, 2021 (JP) .................... 2021-099555

(51) Int. Cl.

| | |
|---|---|
| *H01L 23/535* | (2006.01) |
| *H01L 21/28* | (2006.01) |
| *H01L 21/768* | (2006.01) |
| *H01L 29/423* | (2006.01) |
| *H01L 29/66* | (2006.01) |
| *H01L 29/792* | (2006.01) |

(52) U.S. Cl.
CPC ...... *H01L 23/535* (2013.01); *H01L 21/76805* (2013.01); *H01L 21/76895* (2013.01); *H01L 29/40117* (2019.08); *H01L 29/4234* (2013.01); *H01L 29/66833* (2013.01); *H01L 29/792* (2013.01)

(58) Field of Classification Search
CPC ............. H01L 23/535; H01L 21/76805; H01L 21/76895; H01L 29/40117; H01L 29/4234; H01L 29/66833; H01L 29/792; H10B 43/40; H10B 43/27

See application file for complete search history.

(56) References Cited

U.S. PATENT DOCUMENTS

| | | | |
|---|---|---|---|
| 11,018,133 | B2 | 5/2021 | Or-Bach et al. |
| 11,844,220 | B2 * | 12/2023 | Wang ............... H10B 43/35 |
| 2005/0270849 | A1 | 12/2005 | Lue |
| 2006/0133146 | A1 * | 6/2006 | Maekawa ........ G11C 16/0416 |
| | | | 257/E21.423 |
| 2011/0198593 | A1 | 8/2011 | Kato et al. |
| 2016/0233224 | A1 * | 8/2016 | Rhie ................ H10B 43/10 |
| 2020/0083246 | A1 * | 3/2020 | Inatsuka ......... H01L 29/66568 |
| 2020/0083249 | A1 * | 3/2020 | Matsuura ........... H10B 43/27 |
| 2021/0082951 | A1 | 3/2021 | Toyonaga |
| 2021/0167176 | A1 | 6/2021 | Inden et al. |

FOREIGN PATENT DOCUMENTS

| | | |
|---|---|---|
| CN | 1705101 A | 12/2005 |
| TW | 201735322 A | 10/2017 |
| TW | 202114182 A | 4/2021 |
| WO | WO-2020/054109 A1 | 3/2020 |

* cited by examiner

*Primary Examiner* — Shahed Ahmed
*Assistant Examiner* — Khatib A Rahman
(74) *Attorney, Agent, or Firm* — Foley & Lardner LLP

(57) ABSTRACT

A semiconductor device includes a substrate. A gate insulating film is formed on the surface of the substrate. A first gate electrode layer is formed on the gate insulating film. A second gate electrode layer is formed on the first gate electrode layer and electrically connected to the first gate electrode layer. A first contact extends through the second gate electrode layer to reach the first gate electrode layer. First and second impurity layers are formed on opposite sides of the first and second gate electrode layers.

17 Claims, 10 Drawing Sheets

SEMICONDUCTOR DEVICE AND MANUFACTURING METHOD THEREOF

CROSS-REFERENCE TO RELATED APPLICATION(S)

This application is based upon and claims the benefit of priority from Japanese Patent Application No. 2021-099555, filed Jun. 15, 2021, the entire contents of which are incorporated herein by reference.

FIELD

Embodiments described herein relate generally to a semiconductor device and a manufacturing method thereof.

BACKGROUND

A gate electrode of a transistor used in a semiconductor storage device or the like may be configured with a stacked film of a polysilicon layer and a metal layer. In this case, impurities in the polysilicon layer are absorbed into the metal layer by thermal processing performed after the metal layer is formed on the polysilicon layer. In this case, due to the depletion of the gate electrode, the gate resistance increases, and thus, the switching speed of the transistor slows down. Further, due to the depletion of the gate electrode, the equivalent oxide thickness (EOT) of a gate insulating film increases, and thus, the ON-current of the transistor decreases.

DETAILED DESCRIPTION

Figure 1A:
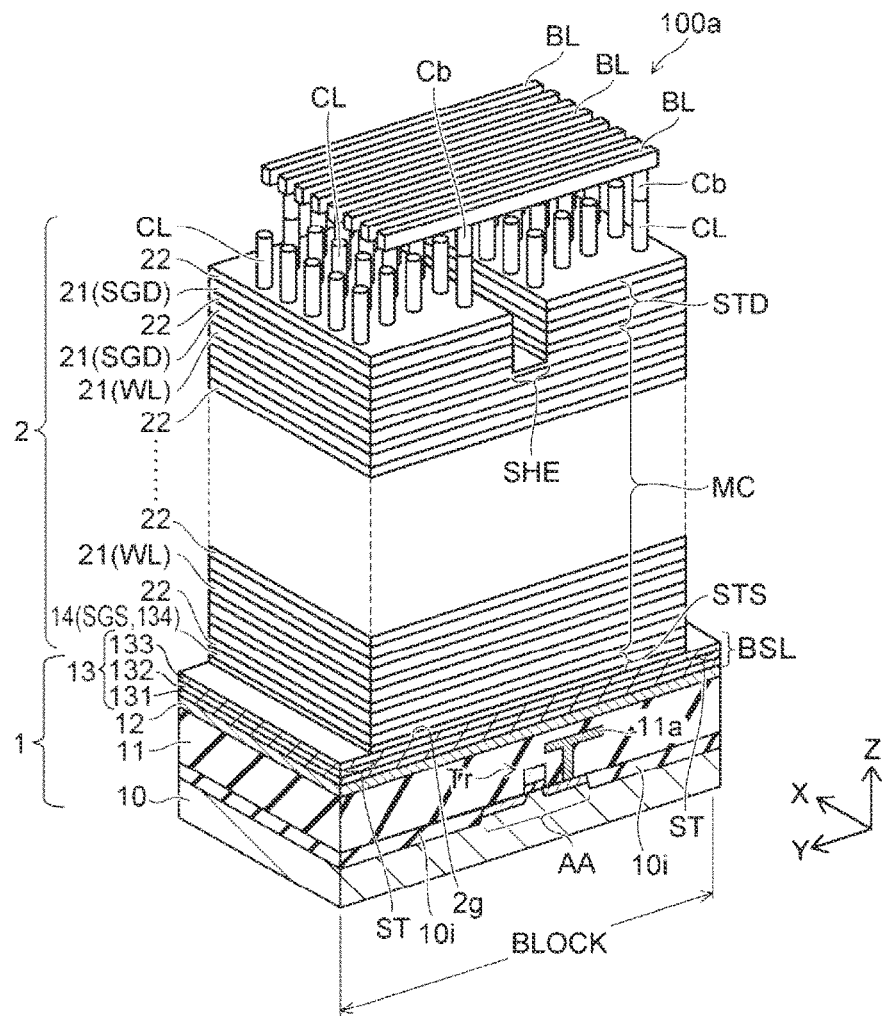
FIG. 1A is a schematic perspective view illustrating a semiconductor storage device according to a first embodiment.

Embodiments provide a semiconductor device capable of reducing the depletion of a gate electrode, and a manufacturing method thereof.

In general, according to at least one embodiment, a semiconductor device includes a substrate. A gate insulating film is formed on the surface of the substrate. A first gate electrode layer is formed on the gate insulating film. A second gate electrode layer is formed on the first gate electrode layer and electrically connected to the first gate electrode layer. A first contact extends through the second gate electrode layer to reach the first gate electrode layer. First and second impurity layers are formed on opposite sides of the first and second gate electrode layers.

Hereinafter, embodiments of the present disclosure will be described with reference to the accompanying drawings. The embodiments are not intended to limit the present disclosure. In the embodiments, the vertical direction of a semiconductor substrate indicates a relative direction in a case where the surface of the semiconductor substrate on which a semiconductor element is provided faces upward, and may be different from the vertical direction according to the gravitational acceleration. The drawings are schematic or conceptual, and the ratio or the like of each part may not be the same as actual one. In the descriptions herein and the drawings, the same components as previously described with respect to the corresponding drawings will be denoted by the same reference numerals, and detailed descriptions thereof will be appropriately omitted.

First Embodiment

Figure 1B:
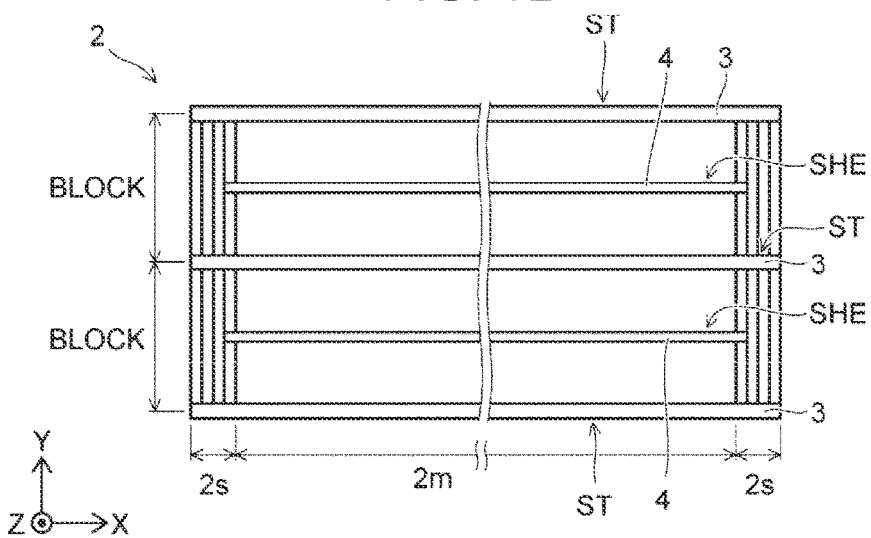
FIG. 1B is a schematic plan view illustrating a stacked body.
Figure 2A:
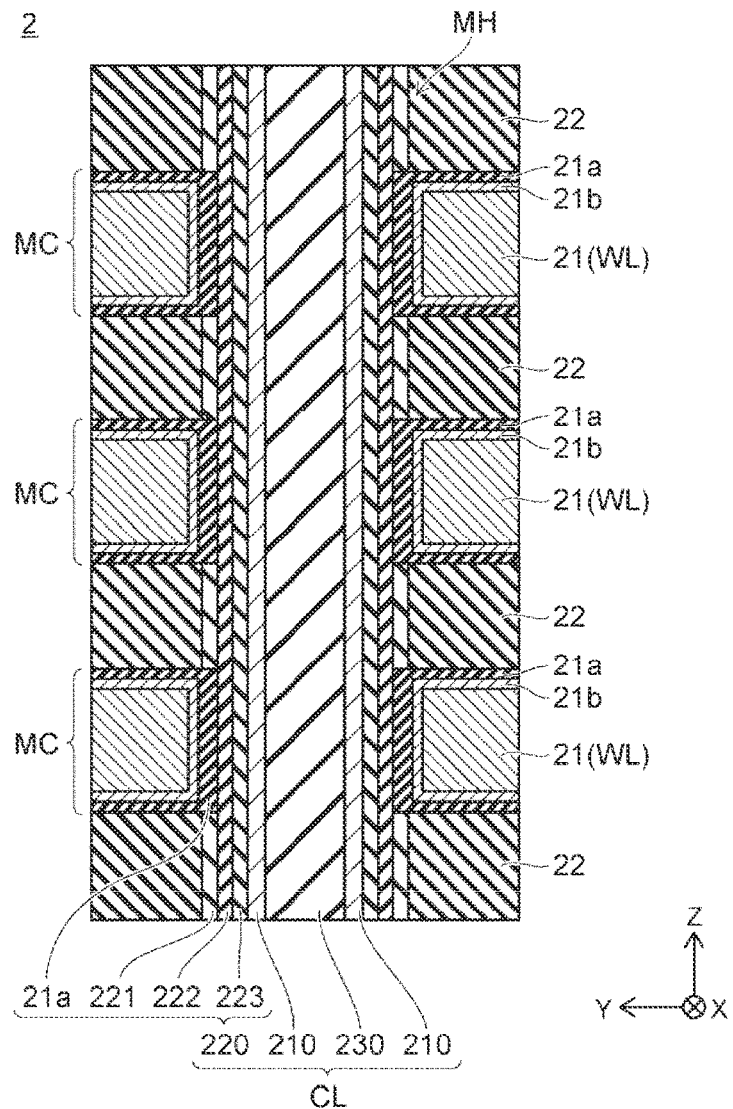
FIG. 2A is a schematic cross-sectional view illustrating a memory cell having a three-dimensional structure.
Figure 2B:
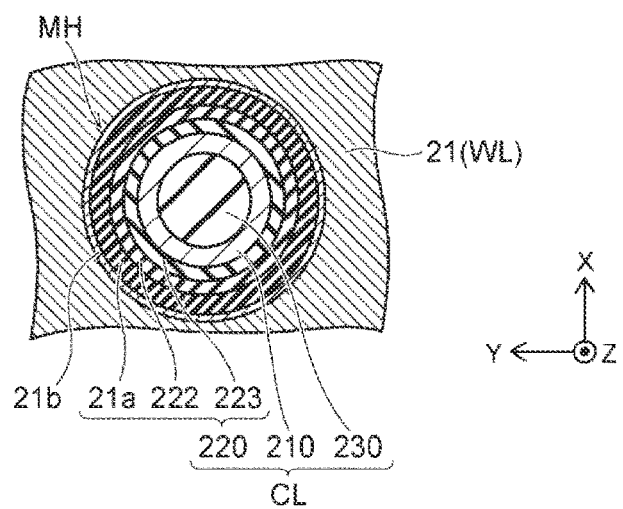
FIG. 2B is a schematic cross-sectional view illustrating a memory cell having a three-dimensional structure.

FIG. 1A is a schematic perspective view illustrating a semiconductor storage device 100a according to a first embodiment. FIG. 1B is a schematic plan view illustrating a stacked body 2. In the descriptions herein, the stacking direction of the stacked body 2 is defined as a Z direction. One direction that intersects, for example, is perpendicular to the Z direction is defined as a Y direction. One direction that intersects, for example, is perpendicular to each of the Z and Y directions is defined as an X direction. FIGS. 2A and 2B are each a schematic cross-sectional view illustrating memory cells having a three-dimensional structure.

As illustrated in FIGS. 1A to 2B, the semiconductor storage device 100a according to the first embodiment is a nonvolatile memory that has memory cells with a three-dimensional structure.

The semiconductor storage device 100a includes a base 1, the stacked body 2, a deep slit ST (a plate-shaped portion 3), a shallow slit SHE (a plate-shaped portion 4), and a plurality of columns CL.

The base 1 includes a substrate 10, an interlayer insulating film 11, a conductive layer 12, and a semiconductor portion 13. The interlayer insulating film 11 which is a first insulating film is formed on the substrate 10. The conductive layer 12 is formed on the interlayer insulating film 11. The semiconductor portion 13 is formed on the conductive layer 12.

The substrate 10 is a semiconductor substrate, for example, a silicon substrate. The conduction type of silicon (Si) is, for example, p type. For example, an element isolation portion STI is formed in the surface area of the substrate 10. The element isolation portion STI is, for example, an insulating area that contains a silicon oxide, and defines an active area AA in the surface area of the substrate 10. In the active area AA, source and drain areas of a transistor Tr are formed. The transistor Tr forms a peripheral circuit (complementary metal oxide semiconductor (CMOS) circuit) of the nonvolatile memory. The CMOS circuit is formed below a buried source line BSL, and formed on the substrate 10. The interlayer insulating film 11 contains, for example, silicon oxide ($SiO_2$), and insulates the transistor Tr. A wiring 11a is provided in the interlayer insulating film 11. The wiring 11a is electrically connected to the transistor Tr. The conductive layer 12 contains a conductive metal, for example, tungsten (W). The semiconductor portion 13 contains, for example, silicon. The conduction type of silicon is, for example, n type. A part of the semiconductor portion 13 may contain undoped silicon.

The conductive layer 12 and the semiconductor portion 13 are electrically connected to each other as an integrated first conductive film, and function as a common source electrode (buried source line) of a memory cell array (2m in FIG. 1B). Accordingly, the conductive layer 12 and/or the semiconductor portion 13 are also referred to as a buried source line BSL.

The stacked body 2 is formed above the substrate 10, and positioned in the Z direction with respect to the buried source line BSL. The stacked body 2 is configured by alternately stacking a plurality of electrode films 21 and a plurality of insulating layers 22 along the Z direction. Each electrode film 21 contains a conductive metal, for example, tungsten. Each insulating layer 22 contains, for example, a silicon oxide. The insulating layer 22 insulates the electrode films 21 adjacent in the Z direction, from each other. The number of stacked layers of the electrode films 21 and the insulating layers 22 is arbitrary. The insulating layer 22 may be, for example, an air gap. For example, an insulating film 2g is formed between the stacked body 2 and the semiconductor portion 13. The insulating film 2g contains, for example, a silicon oxide ($SiO_2$). The insulating film 2g may contain a high dielectric material having a relative dielectric constant higher than that of the silicon oxide. The high dielectric material is, for example, a metal oxide.

The electrode films 21 include at least one source-side select gate SGS, a plurality of word lines WL, and at least one drain-side select gate SGD. The source-side select gate SGS is a gate electrode of a source-side select transistor STS. The word lines WL are gate electrodes of memory cells MC. The drain-side select gate SGD is a gate electrode of a drain-side select transistor STD. The source-side select gate SGS is formed in the lower area of the stacked body 2. The drain-side select gate SGD is formed in the upper area of the stacked body 2. The lower area indicates the area of the stacked body 2 close to the base 1, and the upper area indicates the area of the stacked body 2 far from the base 1. The word lines WL are formed between the source-side select gate SGS and the drain-side select gate SGD.

Among the plurality of insulating layers 22, the insulating layer 22 that insulates the source-side select gate SGS and a word line WL from each other may have a Z-directional thickness larger than, for example, the Z-directional thickness of the insulating layer 22 that insulates the word lines WL from each other. Further, a cover insulating film (not illustrated) may be formed on the uppermost insulating layer 22 farthest from the base 1. The cover insulating film contains, for example, a silicon oxide.

The semiconductor storage device 100a includes a plurality of memory cells MC connected in series between the source-side select transistor STS and the drain-side select transistor STD. The structure in which the source-side select transistor STS, the memory cells MC, and the drain-side select transistor STD are connected in series is called a "memory string" or a "NAND string." The memory string is connected to a bit line BL via, for example, a contact Cb. The bit line BL is formed above the stacked body 2 and extends in the Y direction.

A plurality of deep slits ST and a plurality of shallow slits SHE are formed in the stacked body 2. Each deep slit ST extends in the X direction and is formed in the stacked body 2 while extending through the stacked body 2 from the upper end of the stacked body 2 to the base 1. The plate-shaped portion 3 is formed in the deep slit ST (FIG. 1B). The plate-shaped portion 3 contains, for example, at least an insulating material. The insulating material is, for example, a silicon oxide. The plate-shaped portion 3 may contain a conductive material electrically insulated from the stacked body 2 by an insulating material and electrically connected to the buried source line BSL. The shallow slit SHE extends in the X direction and is formed from the upper end of the stacked body 2 to the middle of the stacked body 2. For example, the plate-shaped portion 4 is formed in the shallow slit SHE (FIG. 1B). The plate-shaped portion 4 is, for example, a silicon oxide.

As illustrated in FIG. 1B, the stacked body 2 includes staircase portions 2s and a memory cell array 2m. The staircase portions 2s are formed at the edges of the stacked body 2. The memory cell array 2m is sandwiched or surrounded by the staircase portions 2s. The deep slit ST is formed from the staircase portion 2s at one end of the stacked body 2 to the staircase portion 2s at the other end of the stacked body 2 through the memory cell array 2m. The shallow slit SHE is formed at least in the memory cell array 2m.

The portion of the stacked body 2 sandwiched between the two plate-shaped portions 3 illustrated in FIG. 1B is called a block (BLOCK). The block is, for example, the smallest unit of data erasure. The plate-shaped portion 4 is formed in the block. The stacked body 2 between the plate-shaped portions 3 and 4 is called a finger. The drain-side select gate SGD is separated for each finger. Thus, during a data write and a data read, one finger in the block may be brought into a selected state by the drain-side select gate SGD.

Each of the plurality of columns CL is formed in a memory hole MH formed in the stacked body 2. Each column CL extends through the stacked body 2 from the upper end of the stacked body 2 along the Z direction, thereby extending into the stacked body 2 and the buried source line BSL. Each of the plurality of columns CL includes a semiconductor body 210, a memory film 220, and a core layer 230. The column CL includes the core layer 230 formed at the center thereof, the semiconductor body 210 formed around the core layer 230, and the memory film 220 formed around the semiconductor body 210. The semiconductor body 210 is electrically connected to the buried source line BSL. The memory film 220 includes a charge capturing portion between the semiconductor body 210 and the electrode film 21. A plurality of columns CL each selected from each finger are commonly connected to one bit line BL via a contact Cb. Each column CL is formed, for example, in the area of the memory cell array 2m.

As illustrated in FIGS. 2A and 2B, the shape of the memory hole MH in the XY plane is, for example, a circle or an ellipse. A block insulating film 21a may be formed between the electrode film 21 and the insulating layer 22, to form a part of the memory film 220. The block insulating film 21a is, for example, a silicon oxide film or a metal oxide film. One example of the metal oxide film is an aluminum oxide film. A barrier film 21b may be formed between the electrode film 21 and the insulating layer 22 and between the electrode film 21 and the memory film 220. For example, when the electrode film 21 is tungsten, a film with a stacked structure of titanium nitride and titanium is selected as the barrier film 21b. The block insulating film 21a restrains a back tunneling of charges from the electrode film 21 toward the memory film 220. The barrier film 21b improves the adhesion between the electrode film 21 and the block insulating film 21a.

The semiconductor body 210 which is a semiconductor member has, for example, a bottomed cylindrical shape. The semiconductor body 210 contains, for example, silicon. Silicon is, for example, polysilicon obtained by crystallizing amorphous silicon. The semiconductor body 210 is, for example, undoped silicon. Further, the semiconductor body 210 may be p-type silicon. The semiconductor body 210 serves as a channel for each of the drain-side select transistor STD, the memory cells MC, and the source-side select transistor STS. The semiconductor body 210 is electrically connected to the buried source line BSL.

A portion of the memory film 220 other than the block insulating film 21a is formed between the inner wall of the memory hole MH and the semiconductor body 210. The memory film 220 has, for example, a cylindrical shape. The plurality of memory cells MC have storage areas between the semiconductor body 210 and the electrode film 21 which serves as a word line WL, and are stacked in the Z direction. The memory film 220 includes, for example, a cover insulating film 221 and a charge capturing film 222, and a tunnel insulating film 223. Each of the semiconductor body 210, the charge capturing film 222, and the tunnel insulating film 223 extends in the Z direction.

The cover insulating film 221 is formed between the insulating layers 22 and the charge capturing film 222. The cover insulating film 221 contains, for example, a silicon oxide. The cover insulating film 221 protects the charge capturing film 222 from being etched when a sacrificial film (not illustrated) is replaced in the electrode film 21 (a replacing step). In the replacing step, the cover insulating film 221 may be removed from between the electrode film 21 and the memory film 220. In this case, as illustrated in FIGS. 2A and 2B, for example, the block insulating film 21a is formed between the electrode film 21 and the charge capturing film 222. Further, when the replacing step is not used for forming the electrode film 21, the cover insulating film 221 may be omitted.

The charge capturing film 222 is formed among the block insulating film 21a, the cover insulating film 221, and the tunnel insulating film 223. The charge capturing film 222 contains, for example, silicon nitride, and has a trap site that traps charges therein. The portion of the charge capturing film 222 sandwiched between the electrode film 21 serving as a word line WL and the semiconductor body 210 makes up a storage area of a memory cell MC which is a charge capturing portion. A threshold voltage of the memory cell MC changes according to the presence/absence of charges in the charge capturing portion or an amount of charges captured in the charge capturing portion. In this way, the memory cell MC stores/maintains information.

The tunnel insulating film 223 is formed between the semiconductor body 210 and the charge capturing film 222. The tunnel insulating film 223 contains, for example, a silicon oxide, or a silicon oxide and a silicon nitride. The tunnel insulating film 223 is an electric potential barrier between the semiconductor body 210 and the charge capturing film 222. For example, when electrons are injected from the semiconductor body 210 into the charge capturing portion (writing operation) and when holes are injected from the semiconductor body 210 into the charge capturing portion (erasing operation), the electrons and the holes each pass through the electric potential barrier of the tunnel insulating film 223 (tunneling).

The core layer 230 is buried in the internal space of the cylindrical semiconductor body 210. The core layer 230 has, for example, a columnar shape. The core layer 230 contains, for example, a silicon oxide, and has an insulating property.

Figure 4:
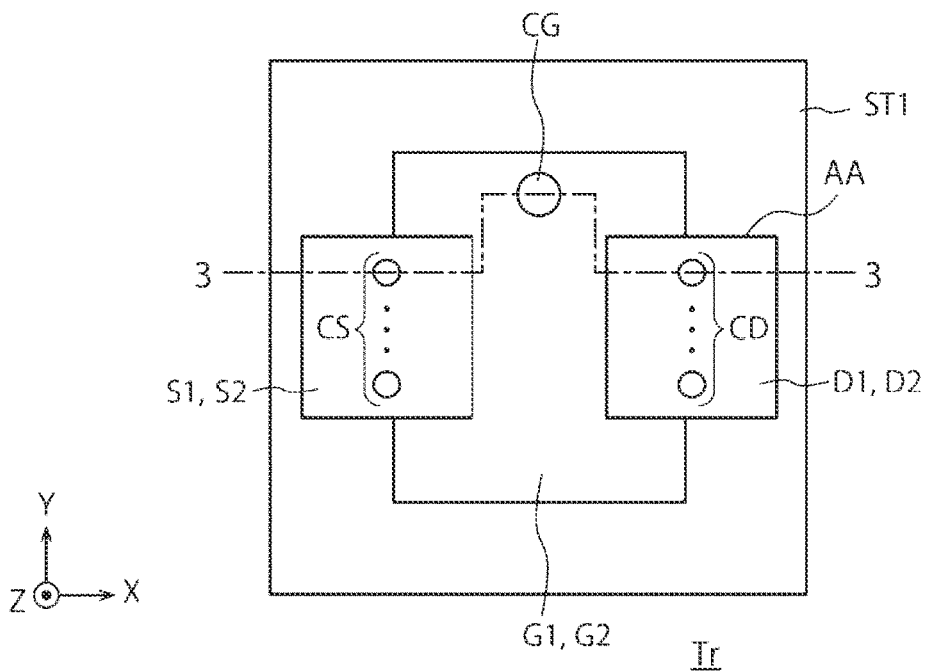
FIG. 4 is a plan view illustrating an example of a configuration of a transistor.

The columns CL, that is, the memory holes MH are arranged in a hexagonal closest-packed arrangement between two slits ST adjacent to each other in the Y direction in the planar layout. As illustrated in FIG. 4, the shallow slit SHE is superimposed on some of the columns CL. The columns CL under the shallow slit SHE do not form memory cells.

The semiconductor portion 13 of FIG. 1A includes, for example, n-type semiconductor layers 131 and 132, and an n-type or undoped semiconductor layer 133. The semiconductor layer 131 is in contact with the conductive layer 12. The semiconductor layer 132 is in contact with each of the semiconductor layer 131 and the semiconductor body 210. For example, the semiconductor layer 132 extends over the portion from which the memory film 220 is removed, to be in contact with the semiconductor body 210. Further, the semiconductor layer 132 surrounds the semiconductor body 210 in the XY plane. The semiconductor layer 133 is in contact with the semiconductor layer 132.

The semiconductor storage device 100a further includes a semiconductor portion 14. The semiconductor portion 14 is disposed between the stacked body 2 and the semiconductor portion 13. The semiconductor portion 14 includes a semiconductor layer 134. The semiconductor layer 134 is formed between an insulating layer 22b closest to the semiconductor portion 13 among the insulating layers 22 and the insulating film 2g. The conduction type of the semiconductor layer 134 is, for example, an n type. The semiconductor layer 134 functions, for example, as a source-side select gate SGS.

Figure 3:
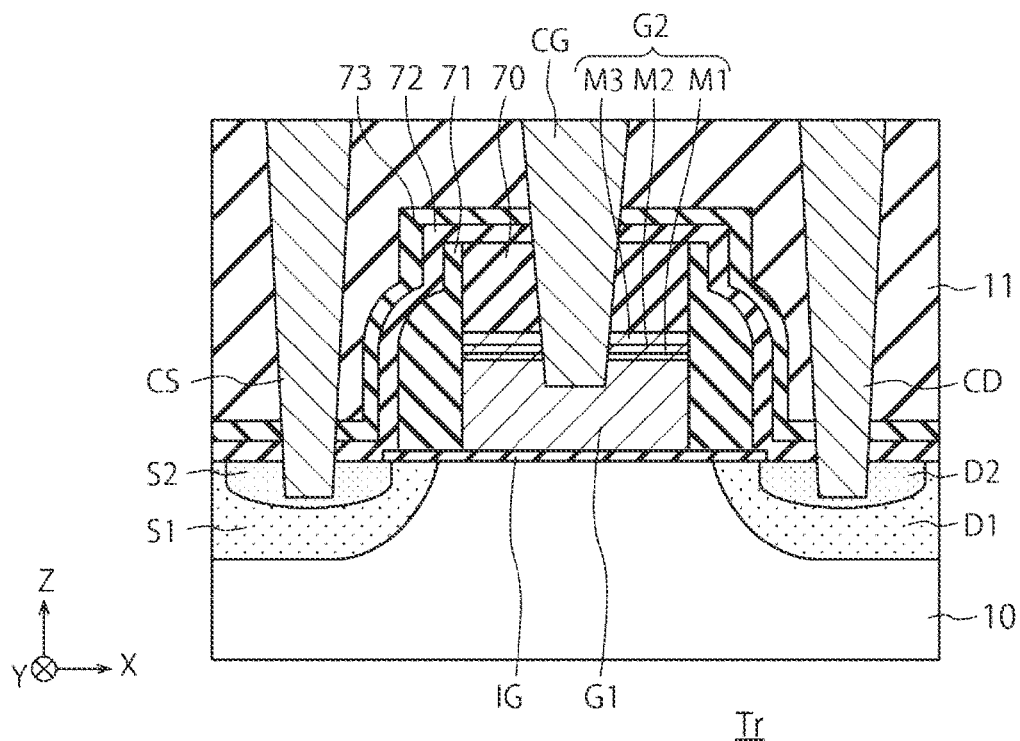
FIG. 3 is a cross-sectional view illustrating an example of a configuration of a transistor.

FIG. 3 is a cross-sectional view illustrating an example of a configuration of the transistor Tr. FIG. 4 is a plan view illustrating an example of the configuration of the transistor Tr. FIG. 3 corresponds to the cross section taken along the line 3-3 of FIG. 4.

The transistor Tr is a semiconductor element that makes up the CMOS of the peripheral circuit of the nonvolatile memory. The transistor Tr is, for example, a P-type metal oxide semiconductor field effect transistor (MOSFET). The transistor Tr includes a gate insulating film IG, gate electrode layers G1 and G2, source layers S1 and S2, drain layers D1 and D2, a gate contact CG, a source contact CS, and a drain contact CD.

The gate insulating film IG is formed on the surface of the substrate 10. For the gate insulating film IG, for example, a silicon oxide film or a high-dielectric material having a relative dielectric constant higher than that of the silicon oxide film is used.

The gate electrode layer G1 is formed on the gate insulating film IG. For the gate electrode layer G1, for example, a conductive material such as polysilicon doped with boron as impurities is used.

The gate electrode layer G2 is formed on the gate electrode layer G1. The gate electrode layer G2 has a stacked structure of metal layers M1 to M3. For the metal layer M1, for example, a conductive metal material such as titanium or the like is used. For the metal layer M2, for example, a conductive metal oxidizing material such as titanium nitride or the like is used. For the metal layer M3, for example, a conductive metal material such as tungsten or the like is used. The gate electrode layer G2 is in direct contact with the gate electrode layer G1 to be electrically connected thereto. The gate electrode layers G1 and G2 function as the gate electrode of the transistor Tr in an integrated form. The gate electrode layer G2 is configured with the metal layers M1 to M3, so that the gate resistance of the transistor Tr may be lowered.

The source layers S1 and S2 and the drain layers D1 and D2 are impurity layers formed on opposite sides of the gate electrode layers G1 and G2. When the transistor Tr is a P-type MOSFET, the source layers S1 and S2 and the drain layers D1 and D2 are, for example, impurity diffusion layers that include boron as impurities.

The source layers S1 and S2 have a structure of two layers having different impurity concentrations. The source layer S1 contains boron having a first impurity concentration. The source layer S2 contains boron having a second impurity concentration higher than the first impurity concentration. The source layer S2 is formed in the source layer S1, and the source layer S1 surrounds the periphery of the source layer S2, in a plan view from above the surface of the substrate 10 (the Z direction). The source layer S2 is formed directly below the source contact CS, and is in electrical contact with the source contact CS with a low resistance.

The drain layers D1 and D2 have a structure of two-layers having different impurity concentrations. The drain layer D1 contains boron having a third impurity concentration. The drain layer D1 contains boron having a fourth impurity concentration higher than the third impurity concentration. The drain layer D2 is formed in the drain layer D1, and the drain layer D1 surrounds the drain layer D2, in a plan view from above the surface of the substrate 10 (the Z direction). The drain layer D1 is formed directly below the drain contact CD, and is in electrical contact with the drain contact CD with a low resistance.

The gate contact CG extends through the interlayer insulating film 11, liner layers 73 and 72, a spacer layer 71, and a cap film 70, and further extends through the gate electrode layer G2 to reach the gate electrode layer G1. That is, the gate contact CG is not only in contact with the gate electrode layer G2 configured with the metal layers M1 to M3, but also extends through the gate electrode layer G2 to be in direct contact with the gate electrode layer G1 made of polysilicon. For the gate contact CG, for example, a metal material such as tungsten or the like is used.

The source contact CS extends through the interlayer insulating film 11, the liner layers 73 and 72, the spacer layer 71, and the cap film 70 to reach the source layer S2. For the source contact CS, for example, a metal material such as tungsten or the like is used. One or more source contacts CS may be formed for one source layer S1 and one source layer S2.

The drain contact CD extends through the interlayer insulating film 11, the liner layers 73 and 72, the spacer layer 71, and the cap film 70 to reach the drain layer D2. For the drain contact CD, for example, a metal material such as tungsten or the like is used. One or more drain contacts CD may be formed for one drain layer D1 and one drain layer D2.

The cap film 70 is formed on the gate electrode layer G2. The cap film 70 is used as a mask when the gate electrode layer G2 is formed. For the cap film 70, for example, an insulating material such as a silicon nitride film or the like is used.

The spacer layer 71 is formed on the side surfaces of the gate electrode layers G1 and G2. For the spacer layer 71, for example, an insulating material such as a silicon oxide film or the like is used.

The liner layers 72 and 73 cover the surfaces of the gate electrode layers G1 and G2, the cap film 70, the spacer layer 71, and the substrate 10. For the liner layers 72 and 73, for example, an insulating material such as a silicon oxide film, a silicon nitride film or the like is used.

Further, the interlayer insulating film 11 is formed on the liner layer 73 to cover the transistor Tr. For the interlayer insulating film 11, for example, an insulating material such as a silicon oxide film or the like is used.

As illustrated in FIG. 4, an element isolation portion STI (shallow trench isolation) is formed around the transistor Tr. The element isolation portion STI defines the active area AA in which a semiconductor element is formed, on the surface of the substrate 10. The source layers S1 and S2 and the drain layers D1 and D2 are formed in the active area AA.

The gate contact CG is disposed at a position where impurities may be additionally introduced into the gate electrode layer G1. One or more gate contacts CG may be formed for one gate electrode layer G1 and one gate electrode layer G2.

Figure 5:
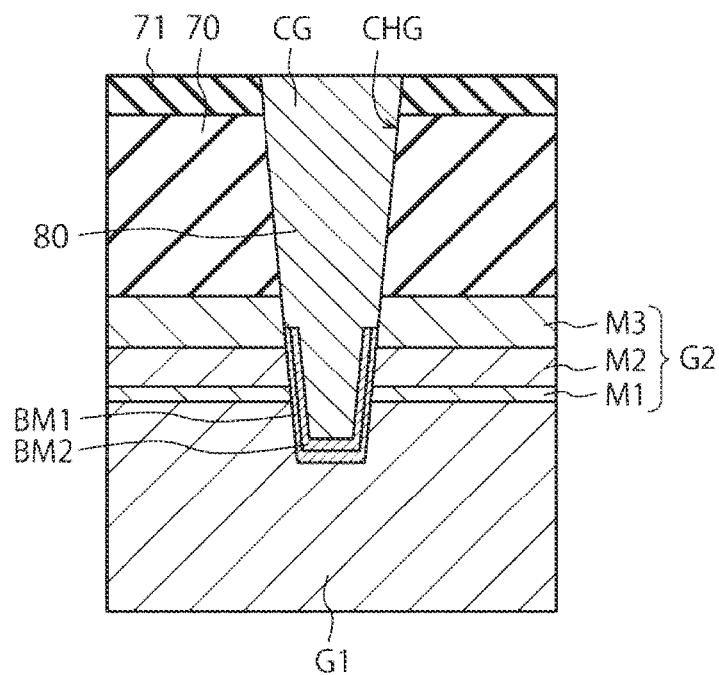
FIG. 5 is a cross-sectional view illustrating an example of a configuration of a gate contact.
Figure 6:
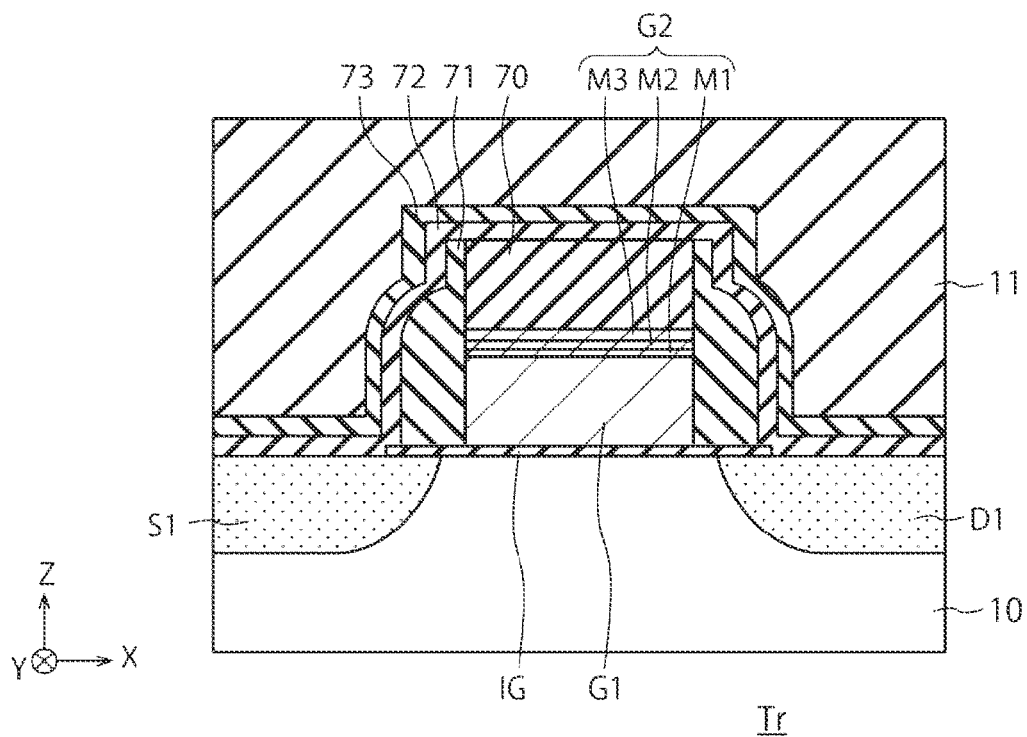
FIG. 6 is a cross-sectional view illustrating an example of a transistor forming method according to the first embodiment.

FIG. 5 is a cross-sectional view illustrating an example of a configuration of the gate contact CG. The gate contact CG includes barrier metal films BM1 and BM2 formed at least on the internal lower portion of a contact hole CHG, and a metal film 80 formed in the barrier metal films BM1 and BM2 to be buried in the contact hole CHG.

The contact hole CHG extends through the interlayer insulating film 11, the liner layers 73 and 72, the spacer layer 71, and the cap film 70, and further extends through the gate electrode layer G2 to reach the gate electrode layer G1. There may be a case where the barrier metal films BM1 and BM2 are formed to cover the entire inner wall of the contact hole CHG, but left only at the bottom of the contact hole CHG. Naturally, the barrier metal films BM1 and BM2 may be left on the entire inner wall of the contact hole CHG. The barrier metal films BM1 and BM2 are provided to reduce the contact resistance between the metal film 80 (e.g., tungsten) and the gate electrode layer G1 (e.g., polysilicon). For the barrier metal film BM1, for example, a conductive metal material such as titanium or the like is used. For the barrier metal film BM2, for example, a conductive metal oxidizing material such as titanium nitride or the like is used. That is, the lower portion of the gate contact CG has, for example, a stacked structure of titanium, titanium nitride, and tungsten, which is the same stacked structure as the gate electrode layer G2. As a result, the gate contact CG may come into contact with both the gate electrode layers G1 and G2 with a low resistance.

According to at least one embodiment, the gate contact CG of the transistor Tr extends through the gate electrode layer G2 configured with the metal layers M1 to M3, to reach the gate electrode layer G1 made of polysilicon below the gate electrode layer G2. As described later, the gate contact CG is formed simultaneously with the source contact CS and the drain contact CD during the step of forming the source contact CS and the drain contact CD. Accordingly, the contact hole CHG of the gate contact CG is formed simultaneously with the contact holes of the source contact CS and the drain contact CD. When impurities (e.g., boron) are introduced into the source layers S1 and S2 and the drain layers D1 and D2 through the contact holes of the source contact CS and the drain contact CD, the impurities are also introduced into the gate electrode layer G1 through the contact hole CHG. In this way, in the present embodiment, impurities may be additionally introduced into the gate electrode layer G1 in the step of forming the gate contact CG.

Generally, boron which is a P-type impurity of the P-type MOSFET may easily diffuse, as compared with phosphorus or arsenic which is an N-type impurity of the N-type MOSFET. Thus, when the CMOS of the peripheral circuit is formed, and then, a memory cell array is formed above the CMOS of the peripheral circuit, the electrical characteristic of the P-type MOSFET (e.g., a contact resistance) changes due to the thermal processing performed at that time. In order to reduce the change in characteristic of the P-type MOSFET, an epitaxial layer (not illustrated) with a high impurity concentration may be formed on the bottoms of the source contact CS and the drain contact CD of the P-type MOSFET.

However, when the epitaxial layer is formed in the source contact CS and the drain contact CD, the gate contact CG needs to be formed in a separate step from that for the source contact CS and the drain contact CD. In this case, impurities may not be additionally introduced into the gate contact CG.

Further, after the gate electrode layers G1 and G2 are formed, the impurities in the gate electrode layers G1 and G2 may be absorbed into the metal layer M1 (e.g., titanium) or diffuse to the substrate 10, due to the thermal processing performed during the step of forming the cap film 70 and the step of forming a memory cell array. In this case, the impurity concentration in the gate electrode layer G1 decreases, and during the driving of the transistor Tr, a depletion layer is generated in the interface between the gate electrode layer G1 and the metal layer M1 and the interface between the gate electrode layer G1 and the gate insulating film IG, in the gate electrode layer G1. The depletion of the interface between the gate electrode layer G1 and the metal layer M1 increases the electrical resistance of the gate electrode layer G1, and decreases the switching speed of the transistor Tr. Further, the depletion of the interface between the gate electrode layer G1 and the gate insulating film IG increases the EOT of the gate insulating film IG, and as a result, decreases the ON-current of the transistor Tr.

Meanwhile, in the semiconductor device according to at least one embodiment, the epitaxial layer is not used for the source contact CS and the drain contact CD, and impurities are introduced through the contact holes of the source contact CS and the drain contact CD. As a result, the impurity concentrations of the source layer S1 and the drain layer D1 are increased, so as to cope with the diffusion of impurities caused from the thermal processing. At this time, the gate contact CG is also formed simultaneously with the source contact CS and the drain contact CD. Accordingly, simultaneously with the introduction of impurities into the source layer S1 and the drain layer D1, the impurities (e.g., boron) are also introduced into the gate electrode layer G1 through the contact hole CHG. Since the contact hole CHG extends through the gate electrode layer G2, the impurities are additionally introduced into the gate electrode layer G1. As a result, the impurity concentration of the gate electrode layer G1 may also be increased, so as to cope with the diffusion of impurities caused from the thermal processing during the formation of the cap film 70 and other thermal processing.

In this way, by supplementing the impurities of the gate electrode layer G1, the depletion in the gate electrode layer G1 during the driving of the transistor Tr may be reduced. As a result, the increase in electrical resistance of the gate electrode layer G1 is reduced, and the thickening of the EOT of the gate insulating film IG is reduced. As a result, the decrease in switching speed of the transistor Tr may be reduced, and the decrease in ON-current of the transistor Tr may be reduced.

Next, a method of forming the transistor Tr according to at least one embodiment will be described.

FIGS. 6 to 9 are cross-sectional views illustrating an example of the method of forming the transistor Tr according to the first embodiment. First, the element isolation portion STI illustrated in FIG. 4 is formed on the substrate 10 (e.g., a silicon substrate), to define the active area AA. The gate insulating film IG (e.g., a silicon oxide film) is formed on the active area AA, and a material for the gate electrode layer G1 (e.g., polysilicon) is formed on the gate insulating film IG. Next, impurities (e.g., boron) are introduced into the material of the gate electrode layer G1 by using, for example, an ion implantation method. Next, the metal layers M1 to M3 are deposited in this order on the material of the gate electrode layer G1. For the metal layer M1, for example, titanium is used. For the metal layer M2, for example, titanium nitride is used. For the metal layer M3, for example, tungsten is used. In this way, the gate electrode layer G2 configured with the stacked film of the metal layers M1 to M3 is formed on the gate electrode layer G1. Further, the metal layers M1 and M2 (titanium and titanium nitride) are formed between the metal layer M3 (tungsten) and the gate electrode layer G1, so that the contact resistance between the metal layer M3 and the gate electrode layer G1 may be reduced.

Next, a material for the cap film 70 (e.g., a silicon nitride film) is formed on the metal layer M3 of the gate electrode layer G2. Due to the thermal processing performed in the step of forming the cap film 70, the impurities of the gate electrode layer G1 are absorbed into the metal layer M1 to some extent or diffused to the substrate 10.

Next, the cap film 70 is processed into the pattern of the gate electrode layers G1 and G2 by using a lithography technique and an etching technique such as a reactive ion etching (RIE) method or the like. Next, the gate electrode layers G2 and G1 are processed through the RIE method or the like by using the cap film 70 as a mask. As a result, the gate electrode layers G1 and G2 are formed.

Next, a material for the spacer layer 71 (e.g., a silicon oxide film) is deposited on the substrate 10, and etched back such that the spacer layer 71 is left on the side surfaces of the gate electrode layers G1 and G2.

Next, by using the spacer layer 71 and the cap film 70 as masks, impurities are introduced into the area where the source layer S1 and the drain layer D1 are formed, through the ion implantation method.

Next, the liner layers 72 and 73 are deposited on the substrate 10, and the interlayer insulating film 11 is further deposited on the liner layers 72 and 73. As a result, the structure illustrated in FIG. 6 may be obtained.

Figure 7:
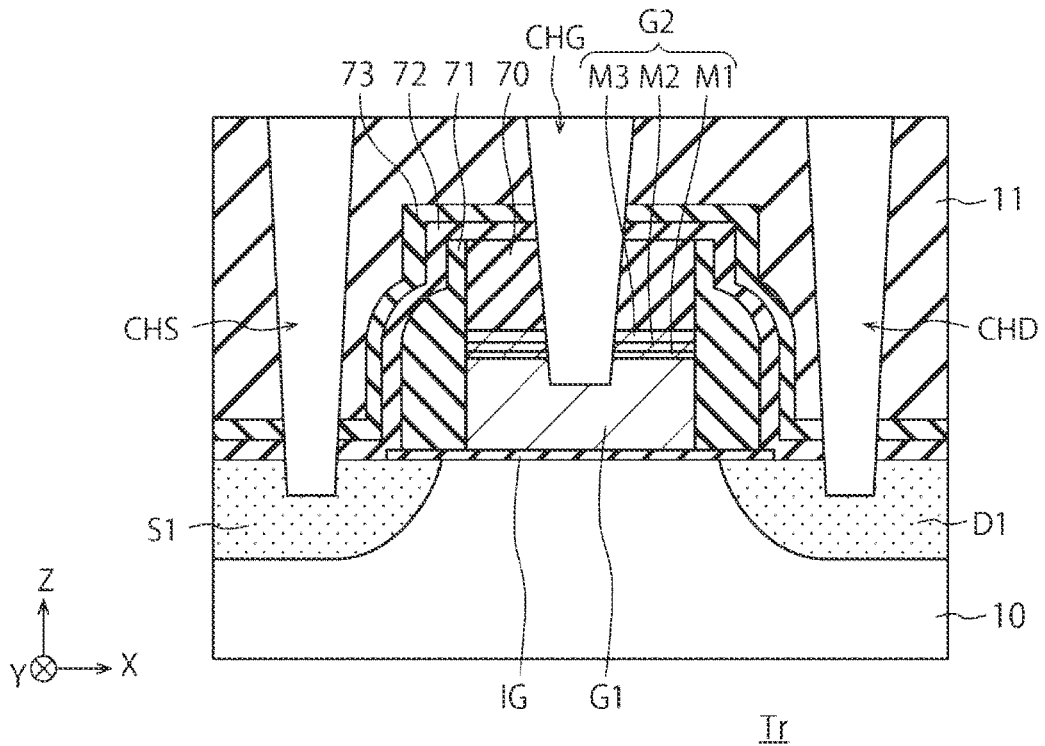
FIG. 7 is a cross-sectional view illustrating the transistor forming method following FIG. 6.

Next, the contact holes CHG, CHS, and CHD are simultaneously formed by using the lithography technique and the etching technique such as the RIE method or the like. As illustrated in FIG. 7, the contact hole CHG is formed to extend through the interlayer insulating film 11, the liner layers 72 and 73, the cap film 70, and the gate electrode layer G2, and reach the gate electrode layer G1. The contact hole CHS is formed to extend through the interlayer insulating film 11 and the liner layers 72 and 73, and reach the source layer S1. The contact hole CHD is formed to extend through the interlayer insulating film 11 and the liner layers 72 and 73, and reach the drain layer D1.

Figure 8:
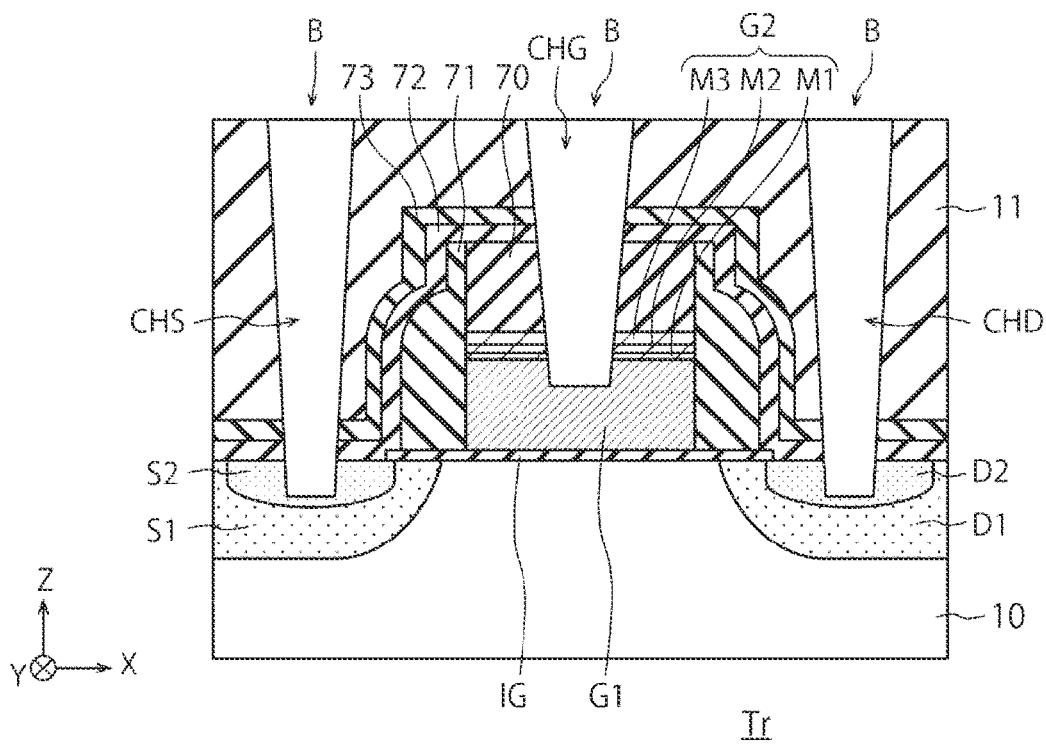
FIG. 8 is a cross-sectional view illustrating the transistor forming method following FIG. 7.

Next, as illustrated in FIG. 8, impurities (e.g., boron B) are simultaneously introduced into the gate electrode layer G1, the source layer S1, and the drain layer D1, through the contact holes CHG, CHS, and CHD of the P-type MOSFET, by using the lithography technique and the implantation technique. As a result, the gate electrode layer G1 may be supplemented with impurities that correspond to the impurities absorbed into the metal layer M1 or diffused to the substrate 10. This leads to a reduction in the depletion of the gate electrode layer G1 as described above. Further, as illustrated in FIG. 8, the source layer S2 is formed in the source layer S1, and the drain layer D2 is formed in the drain layer D1. The source layer S2 has the impurity concentration higher than that of the source layer S1. The drain layer D2 has the impurity concentration higher than that of the drain layer D1. As a result, the contact resistance between the source contact CS and the source layers S1 and S2 and the contact resistance between the drain contact CD and the drain layers D1 and D2 are reduced. At this time, no impurities (e.g., boron) are introduced into the N-type MOSFET.

Figure 9:
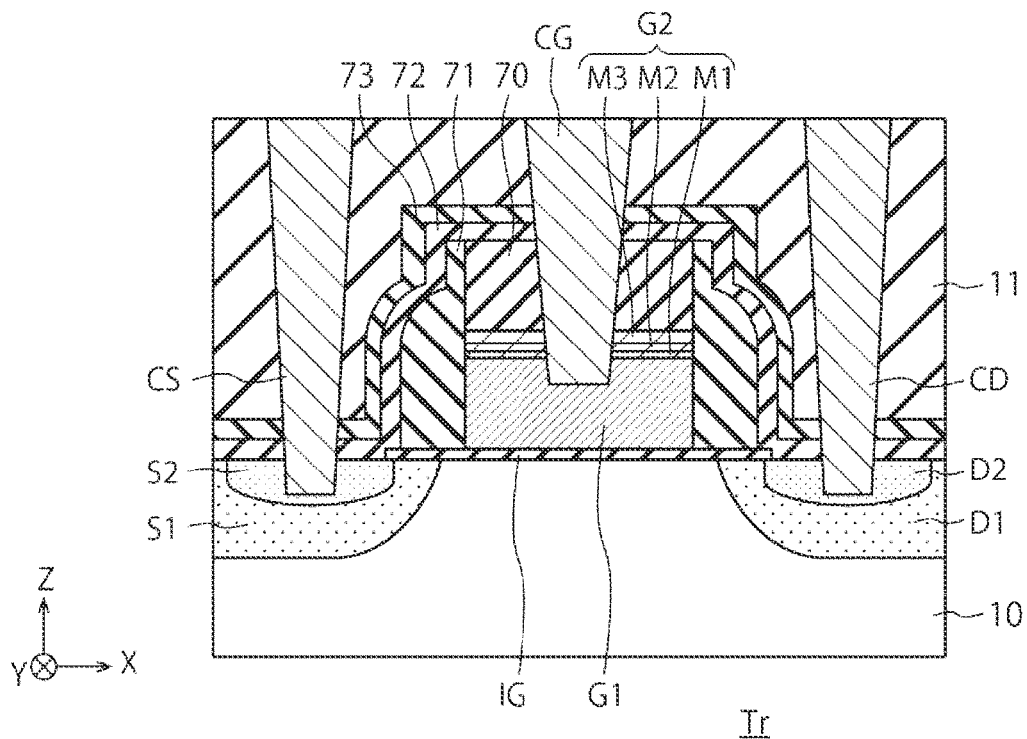
FIG. 9 is a cross-sectional view illustrating the transistor forming method following FIG. 8.

Next, the barrier metal films BM1 and BM2 are simultaneously formed on the inner walls of the contact holes CHG, CHS, and CHD, and a metal film 80 is simultaneously buried further in the barrier metal films BM1 and BM2 (see FIG. 5). As a result, as illustrated in FIG. 9, the contacts CG, CS, and CD may be formed in the same process.

Then, although not illustrated, interlayer insulating films, via contacts, and wiring layers are formed, so that the transistor Tr is completed.

Further, a memory cell array is formed above the transistor Tr, so that the semiconductor storage device 100a illustrated in FIG. 1A is completed. In at least one embodiment, as described above, the peripheral circuit (controller) that controls the memory cell array is formed below the memory cell array.

According to at least one embodiment, in the P-type MOSFET, no epitaxial layer is formed at the bottoms of the source contact CS and the drain contact CD, and impurities are introduced into the source layer S1 and the drain layer D1 by using the ion implantation method. At this time, impurities (e.g., boron B) are introduced not only into the source layer S1 and the drain layer D1, but also into the gate electrode layer G1 through the contact hole CHG. As a result, impurities may be additionally introduced into the gate electrode layer G1, so that the impurity concentration of the gate electrode layer G1 may be kept high. As a result, the depletion of the gate electrode layer G1 may be reduced, so that the increase in electrical resistance of the gate electrode layer G1 may be reduced, and the thickening of the EOT of the gate insulating film IG may be reduced. Accordingly, the switching speed of the transistor Tr may be increased, and the ON-current of the transistor Tr may be increased.

Further, according to at least one embodiment, since no epitaxial layer is formed on the bottoms of the source contact CS and the drain contact CD, the manufacturing costs may be reduced.

Second Embodiment

Figure 10:
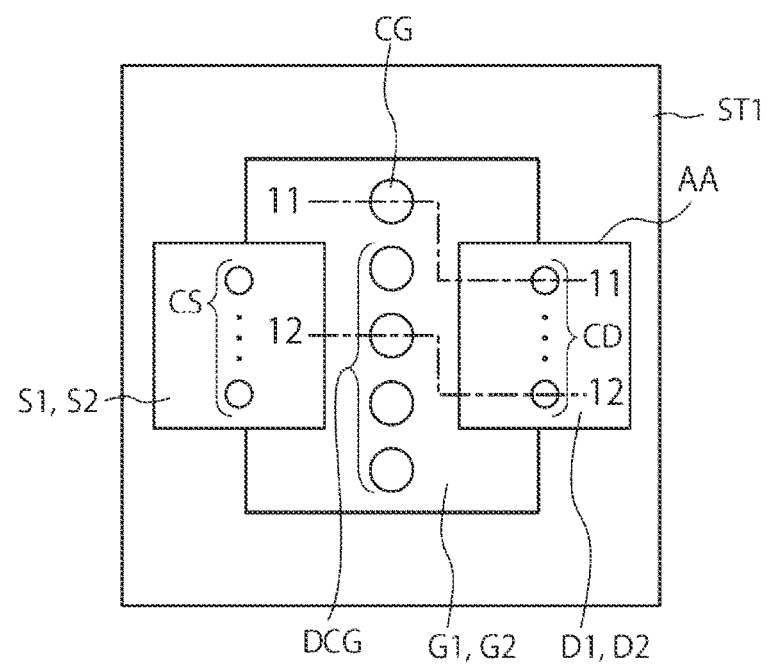
FIG. 10 is a plan view illustrating an example of a configuration of a transistor according to a second embodiment.
Figure 11:
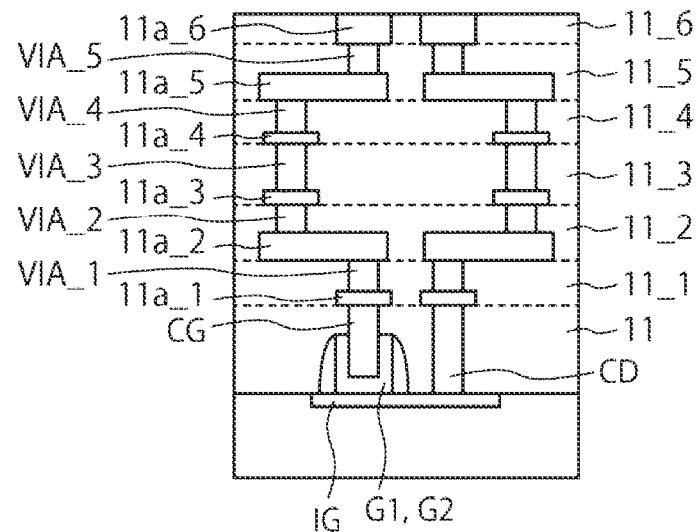
FIG. 11 is a cross-sectional view illustrating an example of the configuration of the transistor according to the second embodiment.
Figure 12:
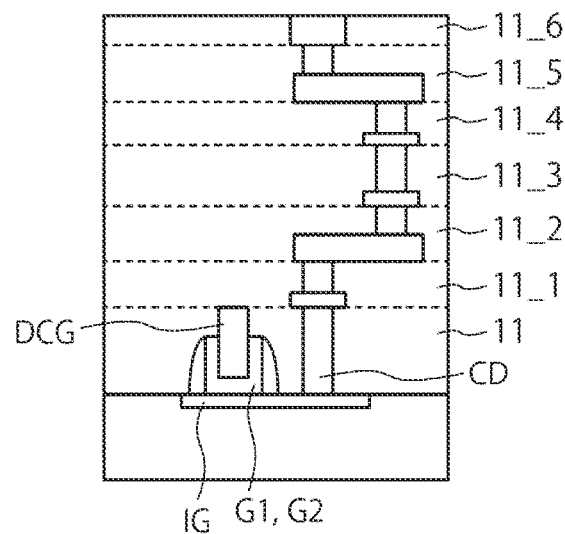
FIG. 12 is a cross-sectional view illustrating an example of the configuration of the transistor according to the second embodiment.

FIG. 10 is a plan view illustrating an example of a configuration of a transistor Tr according to a second embodiment. FIGS. 11 and 12 are cross-sectional views illustrating an example of the configuration of the transistor Tr according to the second embodiment. FIG. 11 represents the cross section taken along the line 11-11 of FIG. 10, and FIG. 12 represents the cross section taken along the line 12-12 of FIG. 10.

The transistor Tr according to the second embodiment is different from the first embodiment in that the transistor Tr of the second embodiment further includes a dummy gate contact DCG. Similarly to the gate contact CG, the dummy gate contact DCG extends through the interlayer insulating film 11, the liner layers 73 and 72, and the gate electrode layer G2 to reach the gate electrode layer G1. Further, similarly to the gate contact CG, the dummy gate contact DCG includes the barrier metal films BM1 and BM2 formed at least on the internal lower portion of the contact hole of the dummy gate contact DCG, and the metal film 80 formed in the barrier metal films BM1 and BM2 to be buried in the contact hole. Accordingly, the configuration of the dummy gate contact DCG itself is the same as the configuration of the gate contact CG. Thus, the dummy gate contact DCG may be formed simultaneously with the gate contact CG.

Meanwhile, as illustrated in FIG. 11, the gate contact CG is electrically connected to wiring layers 11a_1 to 11a_6 above the gate contact CG through via contacts VIA_1 to VIA_5. Meanwhile, as illustrated in FIG. 12, the dummy gate contact DCG is not connected to the wiring layers 11a_1 to 11a_6 and the via contacts VIA_1 to VIA_5. That is, while the gate contact CG is used for applying a voltage to the gate electrode layers G1 and G2 so as to drive the transistor Tr, the dummy gate contact DCG is not used for driving the transistor Tr.

Further, as illustrated in FIGS. 11 and 12, the wiring layers 11a_1 to 11a_6 are formed in interlayer insulating films 11_1 to 11_6, respectively. The via contacts VIA_1 to VIA_5 are formed in the interlayer insulating films 11_1 to 11_5 to connect the wiring layers 11a_1 to 11a_6 to each other.

The dummy gate contact DCG is disposed above the channel area between the source layers S1 and S2 and the drain layers D1 and D2, in a plan view from above the surface of the substrate (the Z direction). A plurality of dummy gate contacts DCG are dispersedly arranged such that impurities (e.g., boron) may be substantially uniformly introduced into the gate electrode layer G1. The dummy gate contacts DCG may be dispersedly or substantially uniformly arranged above the channel area of the transistor Tr. As a result, impurities (e.g., boron) may be substantially uniformly introduced into the gate electrode layer G1 on the channel area. The number and the arrangement of the dummy gate contacts DCG are set to implement the uniform impurity concentration in the gate electrode layer G1 on the channel area.

Further, the dummy gate contact DCG of the second embodiment is not connected to the wiring layers 11a_1 to 11a_6 and the via contacts VIA_1 to VIA_5. Accordingly, the parasitic capacitances of the gate electrode layers G1 and G2 are not significantly increased. Thus, even though the dummy gate contact DCG is formed, the decrease in switching speed of the transistor Tr may be reduced.

Other configurations of the second embodiment may be the same as the corresponding configuration of the first embodiment. As a result, the second embodiment may obtain the same effects as those in the first embodiment.

A method of manufacturing the transistor Tr according to the second embodiment may be basically the same as the manufacturing method in the first embodiment.

That is, in the step of forming the contact hole CHG of the gate contact CG illustrated in FIG. 7, the contact hole CHG of the dummy gate contact DCG is formed to extend through the interlayer insulating film 11, the liner layers 73 and 72, the cap film 70, and the gate electrode layer G2 to reach the gate electrode layer G1. Accordingly, the contact holes CHG of the gate contact CG and the dummy gate contact DCG are simultaneously formed.

Further, in the step of introducing impurities as illustrated in FIG. 8, impurities are simultaneously introduced into the contact holes CHG of the gate contact CG and the dummy gate contact DCG. At this time, the dummy gate contact DCG is disposed above the channel area between the source layers S1 and S2 and the drain layers D1 and D2, in the plan view from the Z direction. Accordingly, the impurities are substantially uniformly introduced into the gate electrode layer G1.

Further, in the step of forming the metal films as illustrated in FIG. 9, the barrier metal films BM1 and BM2, and the metal film 80 are simultaneously formed and buried in the contact holes CHG of the gate contact CG and the dummy gate contact DCG.

In this way, the dummy gate contact DCG may be formed simultaneously with the gate contact CG. Then, the wiring layers 11a_1 to 11a_6 and the via contacts VIA_1 to VIA_5 are connected to the gate contact CG, but are not connected to the dummy gate contact DCG. Accordingly, the parasitic capacitances of the gate electrode layers G1 and G2 are not significantly increased. Thus, even though the dummy gate contact DCG is formed, the decrease in switching speed of the transistor Tr may be reduced.

The dummy gate contacts DCG are dispersedly or substantially uniformly arranged above the channel area between the source layers S1 and S2 and the drain layers D1 and D2, in the plan view from the Z direction. That is, the dummy gate contacts DCG are formed such that impurities (e.g., boron) may be substantially uniformly introduced into the gate electrode layer G1. As a result, the impurities may be substantially uniformly introduced into the gate electrode layer G1 on the channel area.

Figure 13:
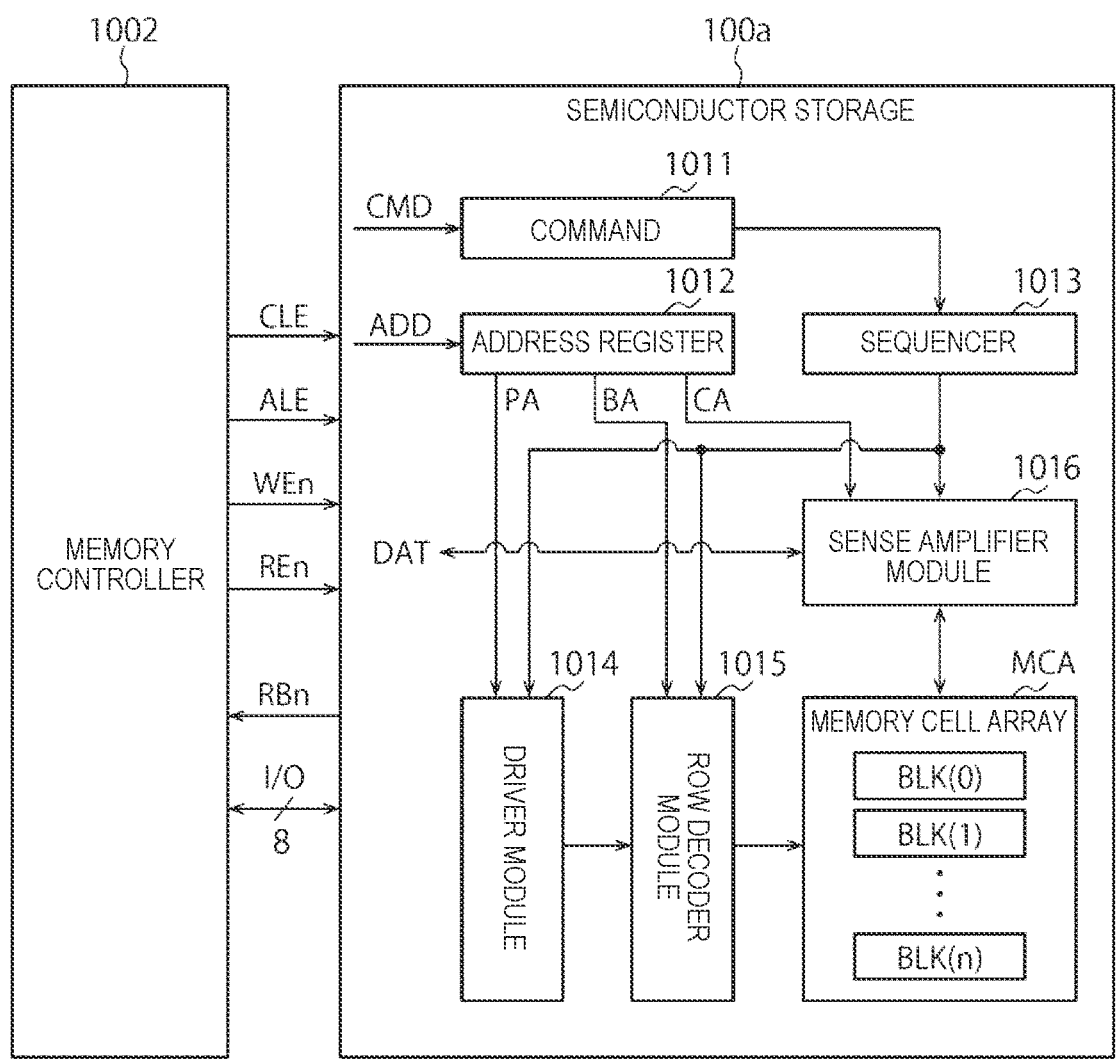
FIG. 13 is a block diagram illustrating an example of a configuration of a semiconductor storage device to which any one of the embodiments above is applied.

FIG. 13 is a block diagram illustrating an example of the configuration of the semiconductor storage device to which any of the above-described embodiments is applied. The semiconductor storage device 100a is a NAND type flash memory capable of storing data in a nonvolatile manner, and is controlled by an external memory controller 1002. The communication between the semiconductor storage device 100a and the memory controller 1002 supports, for example, a NAND interface standard.

As illustrated in FIG. 13, the semiconductor storage device 100a includes, for example, a memory cell array MCA, a command register 1011, an address register 1012, a sequencer 1013, a driver module 1014, a row decoder module 1015, and a sense amplifier module 1016.

The memory cell array MCA includes a plurality of blocks BLK(0) to BLK(n) (n is an integer of 1 or more). A block BLK is a set of a plurality of memory cells capable of storing data in a nonvolatile manner, and is used, for example, as a data erasure unit. Further, in the memory cell array MCA, a plurality of bit lines and a plurality of word lines are formed. Each memory cell is associated with, for example, one bit line and one word line. The detailed configuration of the memory cell array MCA will be described later.

The command register 1011 stores and holds a command CMD received by the semiconductor storage device 100a from the memory controller 1002. The command CMD includes, for example, a command for causing the sequencer 1013 to execute a reading operation, a writing operation, an erasing operation, and others.

The address register 1012 stores and holds address information ADD received by the semiconductor storage device 100a from the memory controller 1002. The address information ADD includes, for example, a block address BA, a page address PA, and a column address CA. For example, the block address BA, the page address PA, and the column address CA are used for selecting a block BLK, a word line, and a bit line, respectively.

The sequencer 1013 controls the entire operation of the semiconductor storage device 100a. For example, the sequencer 1013 controls the driver module 1014, the row decoder module 1015, the sense amplifier module 1016 and others, based on the command CMD stored in the command register 1011, so as to execute the reading operation, the writing operation, the erasing operation and others.

The driver module 1014 generates a voltage to be used in the reading operation, the writing operation, the erasing operation and others. Then, the driver module 1014 applies the generated voltage to a signal line corresponding to a selected word line, based on, for example, the page address PA stored and held in the address register 1012.

The row decoder module 1015 includes a plurality of row decoders. Each row decoder selects one block BLK in a corresponding memory cell array MCA based on the block address BA stored and held in the address register 1012. Then, the row decoder transfers the voltage applied to the signal line corresponding to the selected word line to, for example, the selected word line in the selected block BLK.

During the writing operation, the sense amplifier module 1016 applies a desired voltage to each bit line according to write data DAT received from the memory controller 1002. Further, during the reading operation, the sense amplifier module 1016 determines data stored in a memory cell based on the voltage of the bit line, and transfers the determination result to the memory controller 1002 as read data DAT.

The semiconductor storage device 100a and the memory controller 1002 described above may form a semiconductor device, in a combined form thereof. Examples of the semiconductor device include a memory card such as an SD™ card, an SSD (solid state drive) or the like.

Figure 14:
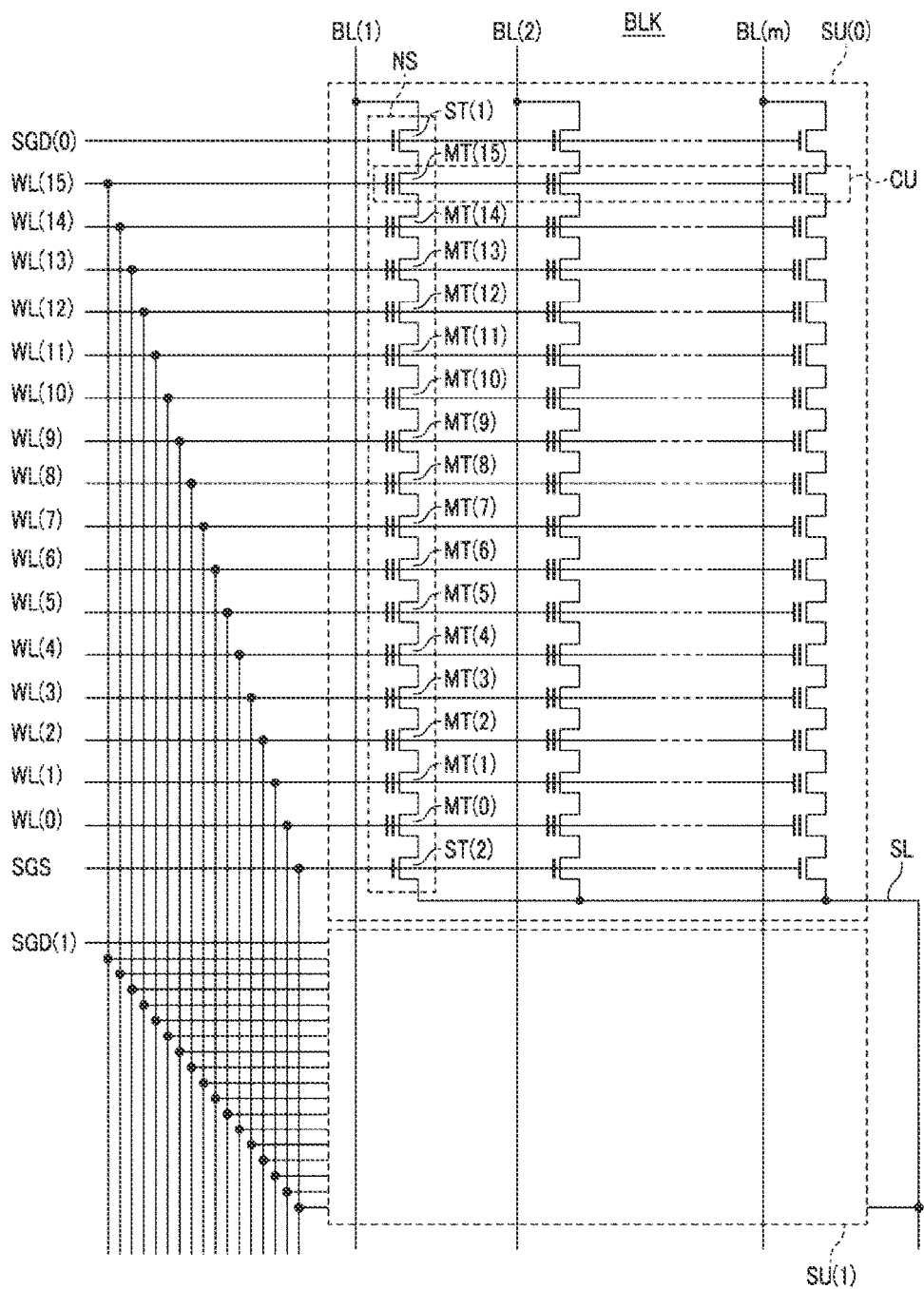
FIG. 14 is a circuit diagram illustrating an example of a circuit configuration of a memory cell array.

FIG. 14 is a circuit diagram illustrating an example of a circuit configuration of the memory cell array MCA. Among a plurality of blocks BLK provided in the memory cell array MCA, one block BLK is being extracted. As illustrated in FIG. 14, the block BLK includes a plurality of string units SU(0) to SU(k) (k is an integer of 1 or more).

Each string unit SU includes a plurality of NAND strings NS associated with bit lines BL(0) to BL(m) (m is an integer of 1 or more), respectively. Each NAND string NS includes, for example, memory cell transistors MT(0) to MT(15) and select transistors ST(1) and ST(2). Each memory cell transistor MT includes a control gate and a charge storage layer, and stores data in a nonvolatile manner. Each of the select transistors ST(1) and ST(2) is used for selecting a string unit SU during various operations.

In each NAND string NS, the memory cell transistors MT(0) to MT(15) are connected to each other in series. The drain of the select transistor ST(1) is connected to the associated bit line BL, and the source of the select transistor ST(1) is connected to one end of the memory cell transistors MT(0) to MT(15) connected in series. The drain of the select transistor ST(2) is connected to the other end of the memory cell transistors MT(0) to MT(15) connected in series. The source of the select transistor ST(2) is connected to a source line SL.

In the same block BLK, the control gates of the memory cell transistors MT(0) to MT(15) are commonly connected to word lines WL(0) to WL(7), respectively. The gates of the select transistors ST(1) in the respective string units SU(0) to SU(k) are commonly connected to select gate lines SGD(0) to SGD(k), respectively. The gates of the select transistors ST (2) are commonly connected to a select gate line SGS.

In the circuit configuration of the memory cell array MCA described above, a bit line BL is shared by the NAND strings NS to which the same column address is assigned, in the respective string units SU. For example, the source line SL is shared among the plurality of blocks BLK.

A set of a plurality of memory cell transistors MT connected to a common word line WL in one string unit SU is referred to as, for example, a cell unit CU. For example, the storage capacity of a cell unit CU including the memory cell transistors MT each of which stores 1-bit data is defined as "1-page data." The cell unit CU may have the storage capacity of two pages or more data, according to the number of bits of data to be stored in a memory cell transistor MT.

The memory cell array MCA provided in the semiconductor storage device 100a according to the present embodiment is not limited to the circuit configuration described above. For example, the number of memory cell transistors MT and the number of select transistors ST(1) and ST(2) provided in each NAND string NS may be freely determined. The number of string units SU provided in each block BLK may be freely determined.

(Modifications)

Figure 15:
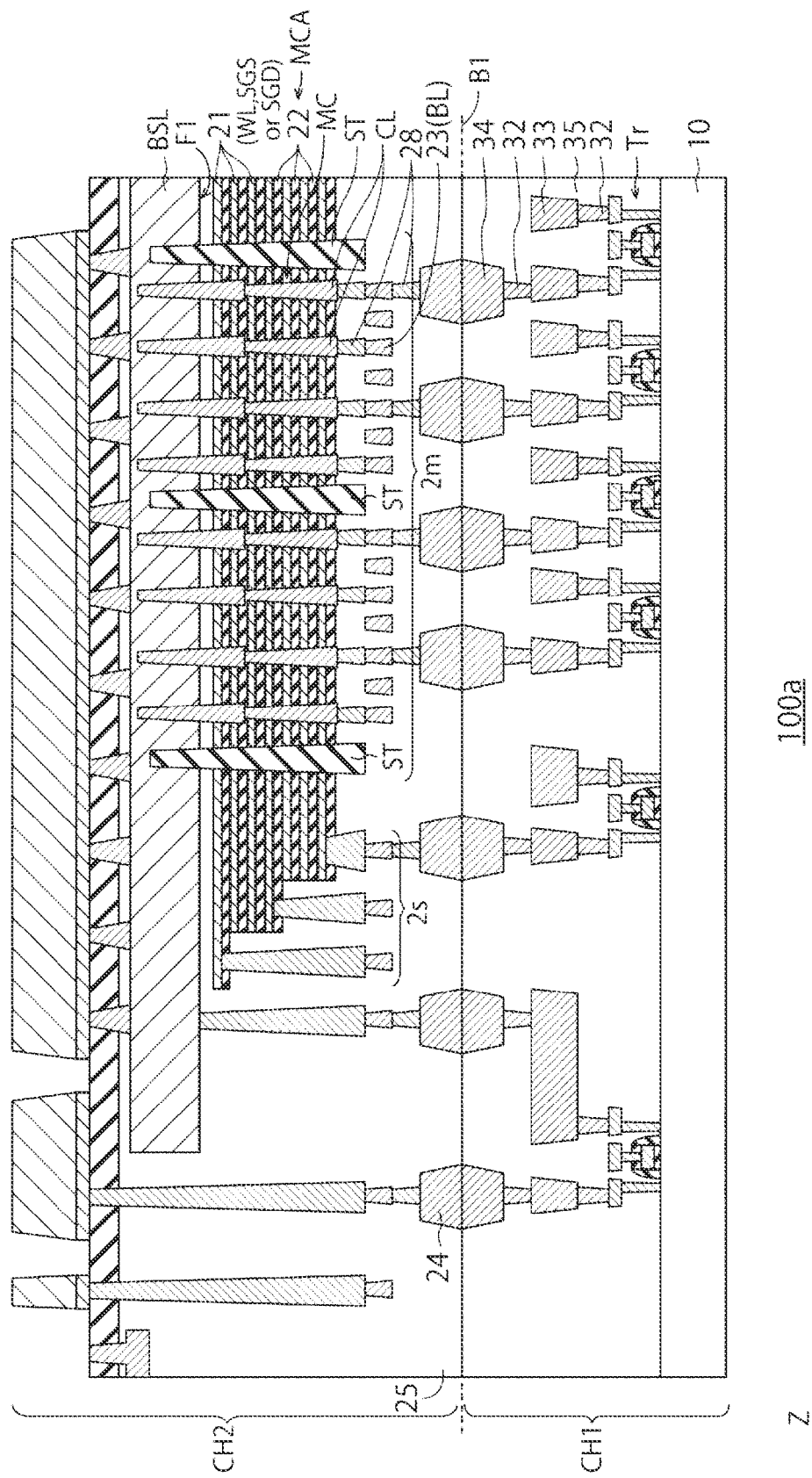
FIG. 15 is a cross-sectional view illustrating another example of the configuration of the semiconductor storage device.

FIG. 15 is a cross-sectional view illustrating another example of the configuration of the semiconductor storage device 100a. The semiconductor storage device 100a includes a memory chip CH2 that includes a memory cell array, and a controller chip CH1 that includes a CMOS circuit. The memory chip CH2 and the controller chip CH1 are bonded to each other on a bonding surface B1, and electrically connected to each other via wirings 24 and 34 bonded to each other on the bonding surface. FIG. 15 represents a state where the memory chip CH2 is mounted on the controller chip CH1.

The configuration of the memory cell array MCA of the memory chip CH2 and the configuration of the CMOS circuit may be the same as those in the above-described embodiments.

In the present embodiment, the memory chip CH2 and the controller chip CH1 are individually formed, and bonded to each other on the bonding surface B1.

In the controller chip CH1, vias 32 and wirings 33 and 34 are formed above the transistor Tr. The wirings 33 and 34 form a multilayer wiring structure in the interlayer insulating film 35. The wiring 34 is buried in the interlayer insulating film 35, and exposed to be substantially flush with the surface of the interlayer insulating film 35. The wirings 33 and 34 are electrically connected to the transistor Tr and others. For the vias 32 and the wirings 33 and 34, for example, a low resistance metal such as copper, tungsten or the like is used. The interlayer insulating film 35 covers and protects the transistor Tr, the vias 32, and the wirings 33 and 34. For the interlayer insulating film 35, for example, an insulating film such as a silicon oxide film or the like is used.

In the memory chip CH2, vias 28 and wirings 23 and 24 are formed below the memory cell array MCA. The wirings 23 and 24 form a multilayer wiring structure in the interlayer insulating film 25. The wiring 24 is buried in the interlayer insulating film 25, and exposed to be substantially flush with the surface of the interlayer insulating film 25. The wirings 23 and 24 are electrically connected to the semiconductor body 210 of a column CL and others. For the vias 28 and the wirings 23 and 24, for example, a low resistance metal such as copper, tungsten or the like is used. The interlayer insulating film 25 covers and protects a stacked body 20, the vias 28, and the wirings 23 and 24. For the interlayer insulating film 25, for example, an insulating film such as a silicon oxide film or the like is used.

The interlayer insulating film 25 and the interlayer insulating film 35 are bonded to each other on the bonding surface B1, and the wiring 24 and the wiring 34 are also bonded to each other on the bonding surface B1 to be substantially flush with each other. As a result, the memory chip CH2 and the controller chip CH1 are electrically connected to each other via the wirings 24 and 34.

As described above, at least one embodiment may be applied to a semiconductor device in which the memory chip CH2 and the controller chip CH1 are bonded to each other.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a substrate;
a gate insulating film formed on the substrate;
a first gate electrode layer formed on the gate insulating film;
a second gate electrode layer formed on the first gate electrode layer and electrically connected to the first gate electrode layer;
a first contact extending through the second gate electrode layer to reach the first gate electrode layer; and
first and second impurity layers formed on opposite sides of the first and second gate electrode layers, respectively.

2. A semiconductor device comprising:
a substrate;
a gate insulating film formed on the substrate;
a first gate electrode layer formed on the gate insulating film;
a second gate electrode layer formed on the first gate electrode layer and electrically connected to the first gate electrode layer;
a first contact extending through the second gate electrode layer to reach the first gate electrode layer;
a first wiring electrically connected to the first contact;
a second contact extending through the second gate electrode layer to reach the first gate electrode layer, wherein the second contact is not electrically connected to a wiring; and
first and second impurity layers formed on opposite sides of the first and second gate electrode layers, respectively.

3. The semiconductor device according to claim 1, further comprising:

a third contact electrically connected to the first impurity layer; and a fourth contact electrically connected to the second impurity layer, wherein the first impurity layer includes a first concentration layer having a first impurity concentration, and includes a second concentration layer formed directly below the third contact, the second concentration layer having a second impurity concentration higher than the first impurity concentration, and the second impurity layer includes a third concentration layer having a third impurity concentration, and includes a fourth concentration layer formed directly below the fourth contact, the fourth concentration layer having a fourth impurity concentration higher than the third impurity concentration.

4. The semiconductor device according to claim 2, wherein the second contact is disposed in a channel area between the first and second impurity layers when viewed from above the surface of the substrate.

5. The semiconductor device according to claim 1, wherein the first and second gate electrode layers and the first and second impurity layers form a P-type metal oxide semiconductor field effect transistor (MOSFET).

6. The semiconductor device according to claim 5, further comprising:

a stacked body formed above the P-type MOSFET, the stacked body including a first insulating film alternately stacked with a first conductive film in a first direction; and a columnar body including a semiconductor portion extending in the first direction in the stacked body, and including a charge capturing film formed on an outer peripheral surface of the semiconductor portion.

7. The semiconductor device according to claim 1, further comprising an insulating cap film formed on the second gate layer.

8. The semiconductor device according to claim 7, wherein the insulating cap film is formed of silicon nitride.

9. The semiconductor device according to claim 7, wherein the first contact extends through the insulating cap film.

10. The semiconductor device according to claim 1, wherein the semiconductor device includes a nonvolatile memory.

11. The semiconductor device according to claim 1, wherein the first gate electrode layer includes doped polysilicon.

12. The semiconductor device according to claim 1, wherein the substrate is a semiconductor substrate.

13. The semiconductor device according to claim 1, wherein the second gate electrode layer includes a plurality of stacked metal layers.

14. The semiconductor device according to claim 6, wherein the first insulating film includes silicon dioxide.

15. The semiconductor device according to claim 6, wherein the columnar body includes a tunnel insulating film adjacent the charge capturing film.

16. The semiconductor device according to claim 15, wherein the columnar body includes a cover insulating film adjacent the charge capturing film.

17. The semiconductor device according to claim 16, wherein the cover insulating film includes silicon oxide.

* * * * *